(12) United States Patent
Lv et al.

(10) Patent No.: US 11,688,824 B2
(45) Date of Patent: Jun. 27, 2023

(54) PHOTOELECTRIC INTEGRATED DEVICE AND MANUFACTURING METHOD THEREOF

(71) Applicant: Silergy Semiconductor Technology (Hangzhou) LTD, Hangzhou (CN)

(72) Inventors: Zheng Lv, Hangzhou (CN); Huisen He, Hangzhou (CN); Xianguo Huang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/307,112

(22) Filed: May 4, 2021

(65) Prior Publication Data

US 2021/0351315 A1    Nov. 11, 2021

(30) Foreign Application Priority Data

May 11, 2020   (CN) .......................... 202010390949.2

(51) Int. Cl.
*H01L 31/18* (2006.01)
*H01L 31/0232* (2014.01)
*H01L 31/101* (2006.01)
*H01L 31/0216* (2014.01)
*H01L 27/146* (2006.01)

(52) U.S. Cl.
CPC ........ *H01L 31/186* (2013.01); *H01L 27/1462* (2013.01); *H01L 27/14685* (2013.01); *H01L 31/02161* (2013.01); *H01L 31/02327* (2013.01); *H01L 31/101* (2013.01)

(58) Field of Classification Search
CPC ............ H01L 31/186; H01L 31/02327; H01L 31/101; H01L 27/1462; H01L 27/14685; H01L 31/02005; H01L 31/02161; H01L 27/14625; H01L 31/02168; Y02P 70/50
See application file for complete search history.

(56) References Cited

U.S. PATENT DOCUMENTS

| 6,580,109 B1 * | 6/2003 | Thomas ............ H01L 27/14643 257/292 |
| 9,361,609 B2 | 6/2016 | Franklin et al. |
| 9,805,630 B2 | 10/2017 | Franklin et al. |
| 2004/0140564 A1 * | 7/2004 | Lee ................... H01L 27/14636 257/E21.579 |
| 2005/0106767 A1 * | 5/2005 | Takahashi ............... H01L 31/10 438/29 |

(Continued)

FOREIGN PATENT DOCUMENTS

| CN | 105302286 A | 2/2016 | |
| EP | 1439582 A2 * | 7/2004 | ....... H01L 21/76805 |
| EP | 2677545 A1 * | 12/2013 | ......... H01L 27/1462 |

*Primary Examiner* — Earl N Taylor

(57) ABSTRACT

A method of manufacturing an optoelectronic integrated device can include: providing a semiconductor substrate including at least one optoelectronic device in the semiconductor substrate; forming a first dielectric layer on a first surface of the semiconductor substrate; forming a multilayer insulating layer on the first dielectric layer; forming a first opening in the multilayer insulating layer to expose the first dielectric layer above the optoelectronic device area; and forming a second dielectric layer on the dielectric layer, where the first dielectric layer and the second dielectric layer are anti-reflection layers.

20 Claims, 3 Drawing Sheets

(56) References Cited

U.S. PATENT DOCUMENTS

| | | | |
|---|---|---|---|
| 2005/0139753 A1* | 6/2005 | Park | H01L 31/02161 250/214.1 |
| 2006/0049439 A1* | 3/2006 | Oh | H01L 27/14625 257/292 |
| 2006/0141653 A1* | 6/2006 | Choi | H01L 27/14687 438/48 |
| 2006/0220025 A1* | 10/2006 | Oh | H01L 27/14609 257/E27.134 |
| 2007/0278604 A1* | 12/2007 | Minixhofer | H01L 31/02327 257/E31.127 |
| 2008/0043491 A1 | 2/2008 | Lin | |
| 2009/0016200 A1* | 1/2009 | Tomomatsu | H01L 27/14687 369/120 |
| 2009/0166518 A1* | 7/2009 | Tay | H01L 27/14629 264/1.24 |
| 2009/0242370 A1 | 10/2009 | Chiang | |
| 2010/0155910 A1* | 6/2010 | Gaebler | H01L 27/1462 438/758 |
| 2010/0163709 A1* | 7/2010 | Leonardi | H01L 31/02165 257/E31.119 |
| 2010/0163759 A1* | 7/2010 | Castagna | G01J 1/4228 257/443 |
| 2010/0265384 A1* | 10/2010 | Tay | H01L 27/14625 257/E31.127 |
| 2011/0031381 A1* | 2/2011 | Tay | H01L 27/14629 250/226 |
| 2012/0294579 A1 | 11/2012 | Chen | |
| 2014/0055408 A1 | 2/2014 | Liu et al. | |
| 2014/0126238 A1 | 5/2014 | Kao et al. | |
| 2014/0226361 A1 | 8/2014 | Vasylyev | |
| 2016/0056196 A1* | 2/2016 | Li | H01L 27/1464 257/435 |
| 2017/0184778 A1 | 6/2017 | Onda et al. | |
| 2019/0122919 A1* | 4/2019 | Hong | H01L 23/5329 |
| 2019/0146135 A1 | 5/2019 | Lin | |
| 2021/0183915 A1* | 6/2021 | Summerfelt | H01L 27/14627 |
| 2021/0193513 A1* | 6/2021 | Tien | H01L 21/76811 |
| 2021/0202831 A1* | 7/2021 | Liu | H01L 43/12 |
| 2021/0351315 A1* | 11/2021 | Lv | H01L 31/02005 |

* cited by examiner

PHOTOELECTRIC INTEGRATED DEVICE AND MANUFACTURING METHOD THEREOF

RELATED APPLICATIONS

This application claims the benefit of Chinese Patent Application No. 202010390949.2, filed on May 11, 2020, which is incorporated herein by reference in its entirety.

FIELD OF THE INVENTION

The present invention generally relates to the field of semiconductor technology, and more particularly optoelectronic integrated devices and methods.

BACKGROUND

Optoelectronic integrated circuits, such as image sensors, are optoelectronic components used to acquire light signals, and to convert them into analog or digital electrical signals. These optoelectronic integrated circuits are widely used in consumer electronics, medical electronics, and portable devices (e.g., digital cameras, smart phones, etc.). The principle of the complementary metal oxide semiconductor (CMOS) image sensor is after the light collected by the microlens passes through the color filter, protective layer, inter-metal dielectric (IMD) layer, and interlayer dielectric (ILD) layer, it is finally received by the n-type or p-type optical sensor unit, and the optical sensor unit converts the number of photons into electronic signals.

DETAILED DESCRIPTION

Figure 1A:
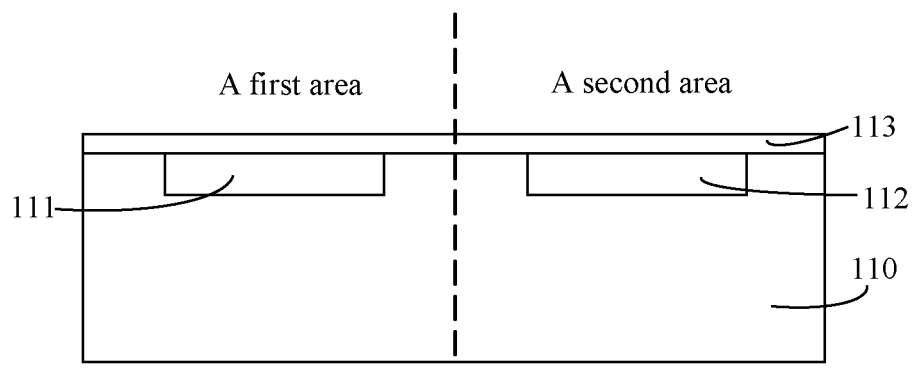
FIGS. 1A-1E are cross-sectional views of various stages of a method of manufacturing an optoelectronic integrated device, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In addition to complementary metal oxide semiconductor image sensors, other commonly used image sensors, including charge coupled devices (CCD) and charge injection devices (CID), red/green/blue (RGB) color filters, etc., are also widely used. Light sensitivity and resonance characteristics are key factors that determine the optical characteristics of optoelectronic integrated circuits. Some ways to increase light sensitivity and improve its resonance characteristics can include adding an additional micro lens layer outside the internal wiring of the integrated circuit. Micro lenses can concentrate light and improve photosensitivity, but may increase complexity and cost, and may not avoid the resonance caused by the reflection and refraction of light by the interface between dielectric layers. In another approach, the light guide feature of the interlayer dielectric layer may be formed, combined with the anti-reflection layer; that is, in order to reduce the refraction and reflection of light by the interface of the multilayer stacked dielectric layer. Although this can increase the light sensitivity and improve the resonance characteristics, and may be necessary to strictly control the thickness of each dielectric layer, and the associated production process is relatively complicated.

Unless the context clearly indicates otherwise, each part of the semiconductor device can be made of material(s) well known to one skilled in the art. The semiconductor material can include, e.g., group III-V semiconductor(s), such as GaAs, InP, GaN, and SiC, and group IV semiconductor(s), such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, $Ni_3Si$, Pt, Ru, W, and their combinations. A gate dielectric may be made of SiO2 or any material having dielectric constant larger than that of SiO2. For example, the gate dielectric may be made of one selected from a group consisting of oxides, nitrides, oxynitrides, silicates, aluminates, and titanates.

In particular embodiments, a method of manufacturing an optoelectronic integrated device can include: providing a semiconductor substrate including at least one optoelectronic device in the semiconductor substrate; forming a first dielectric layer on a first surface of the semiconductor substrate; forming a multilayer insulating layer on the first dielectric layer; forming a first opening in the multilayer insulating layer to expose the first dielectric layer above the optoelectronic device area; and forming a second dielectric layer on the dielectric layer. For example, the first dielectric layer and the second dielectric layer are anti-reflection layers.

Referring now to FIGS. 1A-1E, shown are cross-sectional views of various stages of a method of manufacturing an optoelectronic integrated device, in accordance with embodiments of the present invention. In FIG. 1A, semiconductor base 110, optoelectronic device 111, and IC device 112 can be formed in semiconductor base 110 and arranged side-by-side. Optoelectronic device 111 can be located in a "first" area, and IC device 112 may be located in a "second" area. In this example, optoelectronic device 111 can be configured as a photodiode, and may be formed by injecting a dopant into the semiconductor base to form an n-type region when semiconductor base 110 is p-type doped, or a p-type region when semiconductor base 110 is n-type doped.

For example, the n-type region can be formed by doping phosphorus ions, or the p-type region can be formed by boron ions. The IC device can be configured as a diode, a triode, a resistor, a capacitor, or an inductor as required for the particular application. In this example, the IC device can be configured as a diode, which may also be formed by doping process. In addition, the semiconductor base may include a semiconductor substrate, an epitaxial layer, and other multilayer structures, which may be specifically set according to the structural requirements of the optoelectronic device and the IC device.

Dielectric layer 113 can be formed on a first surface of semiconductor base 110, and dielectric layer 113 may have a uniform thickness. In this example, dielectric layer 113 can include silicon nitride. Of course, dielectric layer 113 can alternatively or additionally include other materials. The thickness of dielectric layer 113 can be in the range of from about 400 Ångströms to about 600 Angstroms, such as from about 450 to about 550 Ångströms. Forming dielectric layer 113 can include a chemical or physical vapor deposition process. Of course, dielectric layer 113 can also be formed by other suitable processes.

Figure 1B:
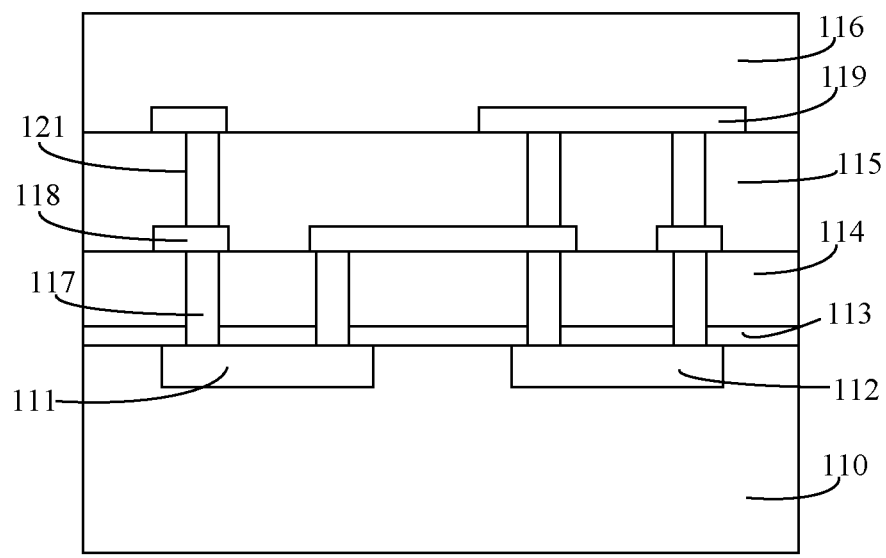

As shown in FIG. 1B, the insulating layer can be formed on dielectric layer 113, and the insulating layer may include multilayer laminated structure. In this example, the multilayer laminated structure can include at least three-layer structure, including interlayer dielectric layer 114, inter-metal dielectric layer 115, and passivation layer 116. Further, a metal interconnection layer may also be formed in the insulating layer for leading out the electrodes of optoelectronic device 111 and IC device 112. The metal interconnection layer can include at least a two-layer structure. In this example, the metal interconnection layer can include an inner metal interconnection layer and a top metal interconnection layer. Each layer of the metal interconnection layer can include a contact layer and a metal layer. For example, the inner metal interconnection layer can include contact layer 117 and metal layer 118, and the top metal interconnection layer can include contact layer 121 and top metal layer 119.

In this example, at least the material of interlayer dielectric layer 114 may be different from the material of dielectric layer 113, in order to prepare for the subsequent etching process. Interlayer dielectric layer 114, inter-metal dielectric layer 115, and passivation layer 116 may all include oxide. For example, interlayer dielectric layer 114 and inter-metal dielectric layer 115 may be respectively set as different types of silicon oxide or a stack thereof. Also for example, passivation layer 116 may be set as a stack of silicon oxide and silicon nitride, or silicon oxynitride, or a stack of silicon oxide and silicon oxynitride. Of course, in other examples, interlayer dielectric layer 114, inter-metal dielectric layer 115, and passivation layer 116 can also be made of other suitable materials.

Figure 1C:
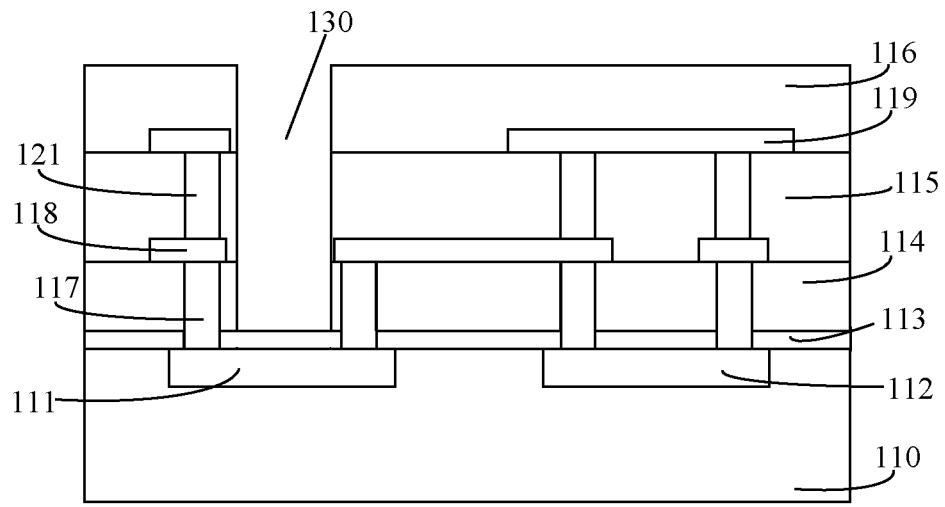

As shown in FIG. 1C, opening 130 can be formed in the insulating layer above an area of photoelectric device 111. That is, opening 130 may be formed in interlayer dielectric layer 114, inter-metal dielectric layer 115, and passivation layer 116. For example, using dielectric layer 113 as an etch stop layer, opening 130 can be formed through an etching process. According to the different reaction gases in the insulating layer and dielectric layer 113 in the etching process, this can determine that the insulating layer is completely etched, and the etching process is stopped. Therefore, in the actual process, dielectric layer 113 may also be etched somewhat, resulting in a decrease in its thickness. It should be noted that the first surface of semiconductor base 110 may not be etched because of the protection of dielectric layer 113, such that the performance of optoelectronic device 111 can be unaffected.

Figure 1D:
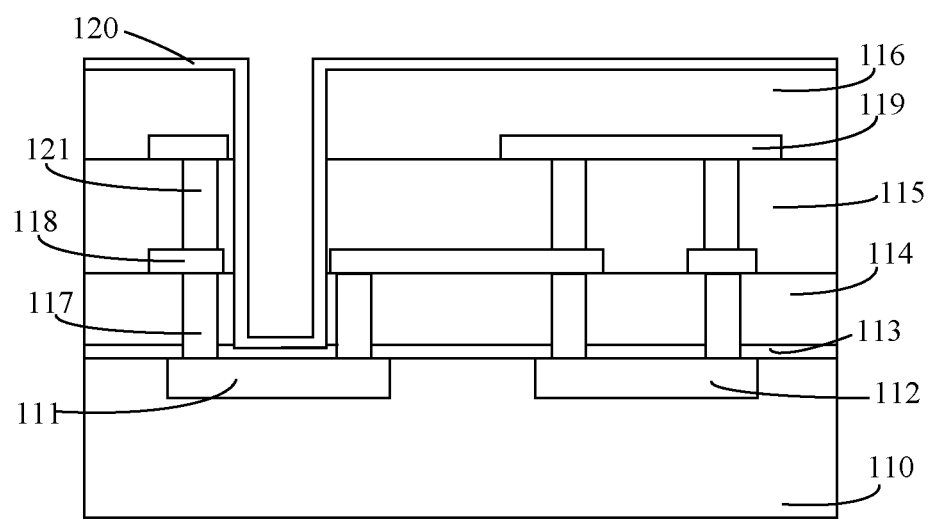

As shown in FIG. 1D, dielectric layer 120 can be formed to cover a bottom portion and inner sidewalls of opening 130, and the upper surface of the insulating layer. Dielectric layer 120 may be formed by a chemical or physical vapor deposition process, and may have a uniform thickness, in order to ensure the optoelectronic characteristics of the optoelectronic device. Of course, dielectric layer 120 can also be formed by other suitable processes. Dielectric layer 120 may be the same material as dielectric layer 113 (e.g., dielectric layer 120 can be a silicon nitride material). Dielectric layer 113 and dielectric layer 120 located thereon may form a conformal shape and serve as an anti-reflection layer of the optoelectronic device. In this example, the thickness of dielectric layer 120 can be from about 250 Ångströms to about 350 Ångströms, such as about 300 Ångströms. The total thickness of the anti-reflection layer can be the remaining thickness of dielectric layer 113 and the thickness of dielectric layer 120, and the total thickness of the anti-reflection layer may be adjusted so that the light in the ideal frequency range is not reflected. For example, the total thickness of the anti-reflection layer can be set such that infrared light are not reflected. The range of the total thickness of the anti-reflection layer can be from about 300 Ångströms to about 700 Ångströms. The anti-reflection layer may also be used to protect the optoelectronic device from the influence of water vapor and metal ions. In addition, dielectric layer 120 located on the upper surface of the insulating layer may also serve as a protective layer on the surface of the IC device area.

Figure 1E:
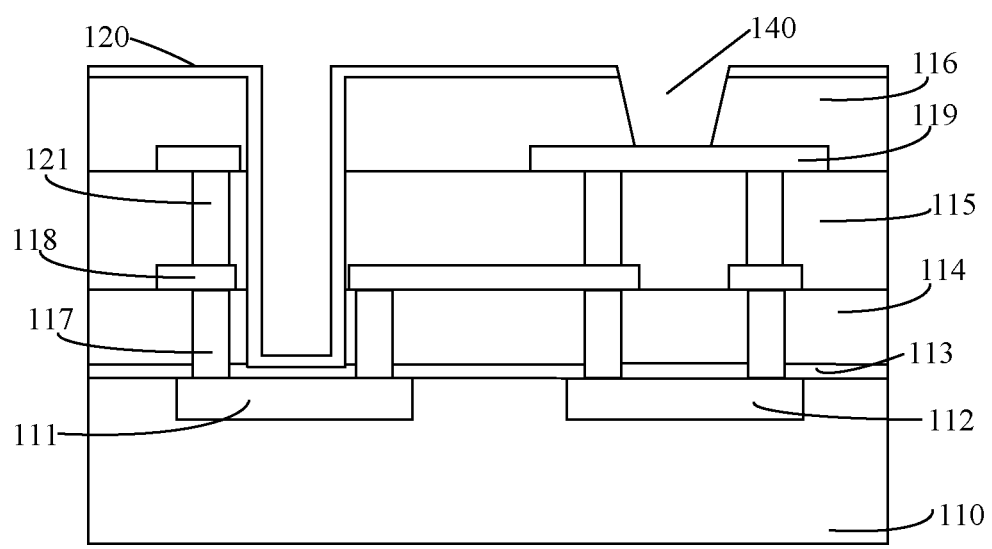

As shown in FIG. 1E, opening 140 may be formed in passivation layer 116, in order to expose metal layer 119 of the top metal interconnection. Metal layer 119 can be connected to external circuits by wire bonding or bumps or redistribution layers (RDL). Opening 140 may be formed by an etching process. The optoelectronic integrated device can then enter a subsequent packaging stage.

In particular embodiments of manufacturing an optoelectronic integrated device, a first dielectric layer and an insulating layer can be formed on a first surface of a semiconductor base, and then a first opening may be formed in the insulating layer on the first dielectric layer to expose the first dielectric layer. Also, a second dielectric layer may be formed on the exposed first dielectric layer, and the first dielectric layer and the second dielectric layer can be configured as an anti-reflection layer. An optoelectronic integrated device provided in certain embodiments may allow light to enter the optoelectronic device only through the anti-reflection layer. As compared with other multilayer dielectric layer approaches, the thickness of the anti-reflection layer in certain embodiments is thinner, which may not only reduce the attenuation of light when passing through the dielectric layer on the surface of the optoelectronic device, but also suppress the problem of light resonance based on the Fabry-Perot effect.

Particular embodiments also provide an optoelectronic integrated device, as shown in FIG. 1E. The photoelectric integrated device can include semiconductor base 110, dielectric layer 113, the insulating layer, and dielectric layer 120. For example, semiconductor base 110 can include photoelectric device 111 and IC device 112 arranged side-by-side, dielectric layer 113 covering a first surface of semiconductor base 110, and the insulating layer covering dielectric layer 113. A first opening can be located in the insulating layer and exposes dielectric layer 113 above the optoelectronic device. Dielectric layer 120 can cover the exposed first dielectric layer for example, dielectric layers 113 and 120 can be configured as anti-reflection layers. Dielectric layer 120 may have a uniform thickness, in order to ensure the optoelectronic properties of the optoelectronic device. Further, dielectric layer 120 can also cover inner sidewalls of the first opening and an upper surface of the insulating layer. In this example, photoelectric device 111 can be configured as a photodiode, and IC device 112 can be configured as a diode, a triode, a resistor, a capacitor, or an inductor, as may be required for a given application. In addition, the semiconductor base may include a semiconductor substrate, an epitaxial layer, and other multilayer structures, which can be set according to the structural requirements of optoelectronic devices and IC devices.

In this example, the insulating layer can include at least a three-layer structure of interlayer dielectric layer 114, inter-metal dielectric layer 115, and passivation layer 116. Further, a metal interconnection layer may also be formed in the insulating layer for leading out the electrodes of optoelectronic device 111 and IC device 112. The metal interconnection layer can include at least a two-layer structure. In this example, the metal interconnection layer can include an inner metal interconnection layer and a top metal interconnection layer. Each layer of the metal interconnection layer can include a contact layer and a metal layer. For example, the inner metal interconnection layer can include contact layer 117 and metal layer 118, and the top metal interconnection layer can include contact layer 121 and top metal layer 119.

For example, the materials of dielectric layer 113 and the insulating layer adjacent to dielectric layer 113 can be different; that is, the materials of dielectric layer 113 and interlayer dielectric layer 114 can be different. The materials of dielectric layer 113 and dielectric layer 120 can be the same. In this example, dielectric layers 113 and 120 can include silicon nitride materials. Interlayer dielectric layer 114, inter-metal dielectric layer 115, and passivation layer 116 may all include oxide. For example, interlayer dielectric layer 114 and inter-metal dielectric layer 115 may be respectively set as different types of silicon oxide, or a stack thereof. Passivation layer 116 may be set as a stack of silicon oxide and silicon nitride, or silicon oxynitride, or a stack of silicon oxide and silicon oxynitride.

In this example, the total thickness of the anti-reflection layer (e.g., the thickness of dielectric layers 113 and 120 on the surface of the optoelectronic device area) can be adjusted such that the light in the ideal frequency range is not reflected. For example, the total thickness of the anti-reflection layer can be adjusted so that infrared light is not reflected. The range of the total thickness of the anti-reflection layer can be from about 300 Ångströms to about 700 Ångströms. The anti-reflection layer can also be used to protect the optoelectronic device from the influence of water vapor and metal ions. In addition, dielectric layer 120 located on the upper surface of the insulating layer may also serve as a protective layer on the surface of the IC device area. In addition, the optoelectronic integrated device further can include opening 140 located in the uppermost insulating layer of the upper region of the IC device, in order to expose top metal layer 119 of the metal interconnection, and top metal layer 119 can be electrically connected to external circuits through wire bonding, bumps, or RDL.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing an optoelectronic integrated device, the method comprising:
   a) providing a semiconductor base having an optoelectronic device;
   b) forming a first dielectric layer on a first surface of the semiconductor base;
   c) forming an insulating layer on the first dielectric layer, wherein the insulating layer comprises an interlayer dielectric layer, an inter-metal dielectric layer, and a passivation layer, wherein the interlayer dielectric layer that is adjacent to the first dielectric layer comprises oxide;
   d) forming a first opening in the insulating layer to expose the first dielectric layer above the optoelectronic device; and
   e) forming a second dielectric layer on the exposed first dielectric layer, wherein the first and second dielectric layers are together configured as an anti-reflection layer, wherein each of the first and second dielectric layers comprises a silicon nitride material, a thickness of the first dielectric layer is in a range of from about 400 Å to about 600 Å, and a thickness of the second dielectric layer is in a range of from about 250 Å to about 350 Å,
   f) wherein an upper surface of the first dielectric layer forms a bottom of the first opening above the optoelectronic device, and wherein a total thickness of the anti-reflection layer over a central region near the bottom of the first opening is not greater than a height of the first opening.

2. The method of claim 1, wherein a material of the first dielectric layer and a material of the insulating layer adjacent to the first dielectric layer are different.

3. The method of claim 1, wherein materials of the first and second dielectric layers are the same.

4. The method of claim 1, wherein each of the first and second dielectric layers comprises a silicon nitride material.

5. The method of claim 1, wherein the forming the first opening comprises:
   a) using the first dielectric layer as an etch stop layer; and
   b) etching the insulating layer by an etching process to form the first opening.

6. The method of claim 1, wherein the second dielectric layer covers an upper surface of the insulating layer and inner sidewalls of the first opening.

7. The method of claim 5, wherein in the etching process, the first dielectric layer is partially etched to decrease a thickness thereof.

8. The method of claim 7, wherein the total thickness of the anti-reflection layer is a sum of the decreased thickness of the first dielectric layer and a thickness of the second dielectric layer, and wherein the total thickness of the anti-reflection layer is predetermined such that light of a predetermined frequency range is not reflected.

9. The method of claim 8, wherein the total thickness of the anti-reflection layer is adjusted such that infrared light in the predetermined frequency range is not reflected.

10. The method of claim 8, wherein the total thickness of the anti-reflection layer is in a range of 300 to 700 Ångströms.

11. The method of claim 1, wherein the insulating layer comprises a three-layer laminated structure.

12. The method of claim 1, further comprising forming an integrated circuit (IC) device in the semiconductor base.

13. The method of claim 12, further comprising forming a metal interconnection layer in the insulating layer, wherein the metal interconnection layer is configured to provide connectivity to electrodes of the optoelectronic device and the IC device.

14. The method of claim 13, wherein the metal interconnection layer comprises at least two layers.

15. The method of claim 1, wherein the insulating layer comprises an oxide material.

16. The method of claim 13, further comprising forming a second opening in an uppermost insulating layer located above the IC device, in order to expose a top metal of the metal interconnection layer.

17. The method of claim 1, wherein the optoelectronic device is configured as a photodiode.

18. The method of claim 12, wherein the IC device is configured as one of a diode, a triode, a resistor, a capacitor, and an inductor.

19. An optoelectronic integrated device, comprising:
   a) a semiconductor base having an optoelectronic device in the semiconductor base;
   b) a first dielectric layer covering a first surface of the semiconductor base;
   c) an insulating layer covering the first dielectric layer, wherein the insulating layer comprises an interlayer dielectric layer, an inter-metal dielectric layer, and a passivation layer, wherein the interlayer dielectric layer that is adjacent to the first dielectric layer comprises oxide;
   d) a first opening located in the insulating layer above the optoelectronic device; and
   e) a second dielectric layer within the first opening and covering the first dielectric layer, wherein the first and second dielectric layers are configured as an anti-reflection layer, wherein each of the first and second dielectric layers comprises a silicon nitride material, a thickness of the first dielectric layer is in a range of from about 400 Å to about 600 Å, and a thickness of the second dielectric layer is in a range of from about 250 Å to about 350 Å,
   f) wherein an upper surface of the first dielectric layer forms a bottom of the first opening above the optoelectronic device, and wherein a total thickness of the anti-reflection layer over a central region near the bottom of the first opening is not greater than a height of the first opening.

20. The optoelectronic integrated device of claim 19, wherein a material of the first dielectric layer and a material of the insulating layer adjacent to the first dielectric layer are different.

* * * * *